(12) United States Patent
Karol et al.

(10) Patent No.: US 12,376,222 B2
(45) Date of Patent: Jul. 29, 2025

(54) PRINTED CIRCUIT BOARD WITH PASSTHROUGH SIGNAL CONNECTIONS BETWEEN A RADIO-FREQUENCY SYSTEM AND AN ANTENNA MODULE

(71) Applicant: Apple Inc., Cupertino, CA (US)

(72) Inventors: David A Karol, San Francisco, CA (US); Zhong J Ma, Mountain View, CA (US); Sean M Gordoni, Santa Clara, CA (US); Daniel J Morizio, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 282 days.

(21) Appl. No.: 18/160,831

(22) Filed: Jan. 27, 2023

(65) Prior Publication Data

US 2024/0080967 A1    Mar. 7, 2024

Related U.S. Application Data

(60) Provisional application No. 63/404,135, filed on Sep. 6, 2022.

(51) Int. Cl.
   *H05K 1/02* (2006.01)
   *H01Q 1/12* (2006.01)
   *H05K 1/11* (2006.01)

(52) U.S. Cl.
   CPC ............. *H05K 1/0243* (2013.01); *H01Q 1/12* (2013.01); *H05K 1/115* (2013.01); *H05K 2201/10098* (2013.01); *H05K 2201/10734* (2013.01)

(58) Field of Classification Search
   CPC ................ H05K 1/0243; H05K 1/115; H05K 2201/10098; H05K 2201/10734; H01Q 1/12
   USPC ........................................................ 361/783
   See application file for complete search history.

(56) References Cited

U.S. PATENT DOCUMENTS

| | | | |
|---|---|---|---|
| 7,477,197 B2 | 1/2009 | Zeng et al. | |
| 8,269,671 B2 | 9/2012 | Chen et al. | |
| 9,059,490 B2 | 6/2015 | DeVries et al. | |
| 9,196,951 B2 | 11/2015 | Baks et al. | |
| 9,337,526 B2 | 5/2016 | Hong et al. | |
| 9,985,346 B2 * | 5/2018 | Baks | H01Q 1/22 |
| 11,605,891 B2 * | 3/2023 | Park | H01Q 9/0407 |

(Continued)

*Primary Examiner* — Binh B Tran
(74) *Attorney, Agent, or Firm* — Treyz Law Group; Jason Tsai

(57) ABSTRACT

An assembly is provided that includes a printed circuit board, a transceiver integrated circuit mounted on a first surface of the printed circuit board, and an antenna module having multiple antennas and that is mounted on a second surface of the printed circuit board. The antenna module at least partially overlaps with the transceiver integrated circuit in an overlap region. The antenna module is electrically coupled to the transceiver integrated circuit via direct passthrough signal connections that extend from the first surface to the second surface. The direct passthrough signal connections are located within the overlap region. Each of the direct passthrough signal connections can be implemented using through-board stacked via structures. The antenna module can include multiple layers of signal routing lines for distributing the signals from the direct passthrough signal connections to the various antennas on the antenna module.

18 Claims, 9 Drawing Sheets

(56) References Cited

U.S. PATENT DOCUMENTS 11,626,373 B2 * 4/2023 You .................... H01L 25/105
257/659
2016/0306034 A1 10/2016 Trotta et al.

* cited by examiner

PRINTED CIRCUIT BOARD WITH PASSTHROUGH SIGNAL CONNECTIONS BETWEEN A RADIO-FREQUENCY SYSTEM AND AN ANTENNA MODULE

This application claims the benefit of U.S. Provisional Patent Application No. 63/404,135, filed Sep. 6, 2022, which is hereby incorporated by reference herein in its entirety.

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

The wireless transceiver circuitry, the antennas, and other processing subsystems can all be mounted on a main logic board within an electronic device. It can be challenging to route signals between all of the components within a limited space on the main logic board while meeting performance requirements. It is within this context that the embodiments herein arise.

SUMMARY

An electronic device may include wireless communications circuitry. The wireless communications circuitry may include one or more processors or signal processing blocks for generating and receiving baseband (digital) signals, a transceiver having a transmitter for generating corresponding radio-frequency signals based on the baseband signals and having a receiver for generating corresponding baseband signals based on received radio-frequency signals, one or more radio-frequency transmitting amplifiers configured to amplify the radio-frequency signals for transmission by one or more antennas in the electronic device, and one or more radio-frequency receiving amplifiers configured to amplify radio-frequency signals received by one or more antennas in the electronic device.

An aspect of the disclosure provides an assembly that includes a printed circuit board (PCB) having a first outer surface and a second outer surface opposing the first outer surface, a semiconductor package disposed on the first outer surface of the printed circuit board and occupying a first region on the printed circuit board, and an antenna module disposed on the second outer surface of the printed circuit board and occupying a second region on the printed circuit board, where the first and second regions are at least partially overlapping in an overlapping region. The PCB can include stacked via structures that extend from the first outer surface to the second outer surface and that electrically couple the semiconductor package to the antenna module. The PCB can include ground connections that surround the stacked via structures. The antenna module can include a first antenna configured to receive radio-frequency signals via a first signal path on the antenna module and a second antenna configured to receive radio-frequency signal via a second signal path on the antenna module. The antenna module can include an antenna structure, a first signal routing line coupled to the antenna structure and formed in a first routing layer in the antenna module, a second signal routing line coupled to the antenna structure and formed in a second routing layer in the antenna module, a first pair of ground lines routed along the first signal routing line and formed in the first routing layer, and a second pair of ground lines routed along the second signal routing line and formed in the second routing layer.

An aspect of the disclosure provides wireless circuitry that includes a circuit board, a radio-frequency transceiver coupled to a first side of the circuit board, and one or more antennas coupled to a second side of the circuit board that is different than the first side, where the one or more antennas are configured to receive radio-frequency signals from the radio-frequency transceiver through via structures traversing a height of the circuit board. The circuit board can include ground structures around the via structures, the ground structures traversing the height of the circuit board. A first array of solder balls can be disposed between the radio-frequency transceiver and the first side of the circuit board, and a second array of solder balls can be disposed on the second side of the circuit board and coupled to the one or more antennas. The one or more antennas can be part of a phased antenna array. The one or more antennas can be formed as part of an antenna module, where at least one of the antennas is configured to receive radio-frequency signals via a first set of signal routing paths formed in a first routing layer of the antenna module and via a second set of signal routing paths formed in a second routing layer of the antenna module different than the first routing layer.

An aspect of the disclosure provides an apparatus that includes a circuit board, an integrated circuit coupled to a first side of the circuit board, and an antenna module coupled to a second side of the circuit board opposing the first side, where the circuit board includes vertical signal connections configured to convey radio-frequency signals between the integrated circuit and the antenna module. The circuit board can include vertical ground connections surrounding the signal connections. The antenna module can include at least one antenna structure, a first signal routing path coupling the at least one antenna structure to a first signal connection in the vertical signal connections, the first signal routing path being formed in a first layer of the antenna module, and a second signal routing path coupling the at least one antenna structure to a second signal connection in the vertical signal connections, the second signal routing path being formed in the first layer of the antenna module. The antenna module can further include a third signal routing path coupling the at least one antenna structure to a third signal connection in the vertical signal connections, the third signal routing path being formed in a second layer of the antenna module different than the first layer, and a fourth signal routing path coupling the at least one antenna structure to a fourth signal connection in the vertical signal connections, the fourth signal routing path being formed in the second layer of the antenna module. The integrated circuit and the antenna can have at least partially overlapping footprints on the circuit board.

DETAILED DESCRIPTION

Figure 1:
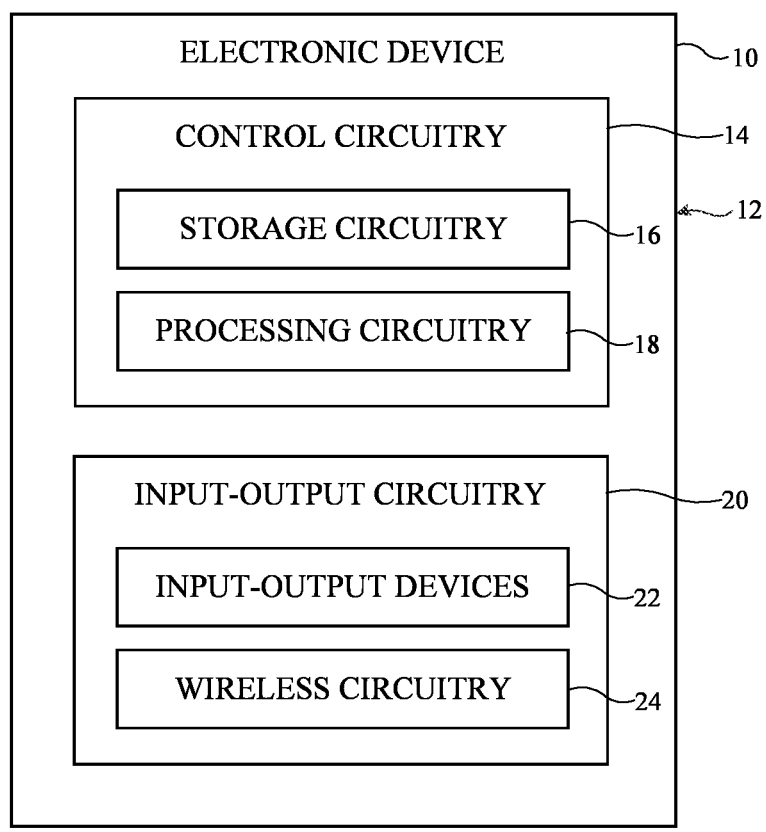
FIG. 1 is a diagram of an illustrative electronic device having wireless circuitry in accordance with some embodiments.

FIG. 1 is a block diagram of an electronic device such as electronic device 10. Electronic device 10 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
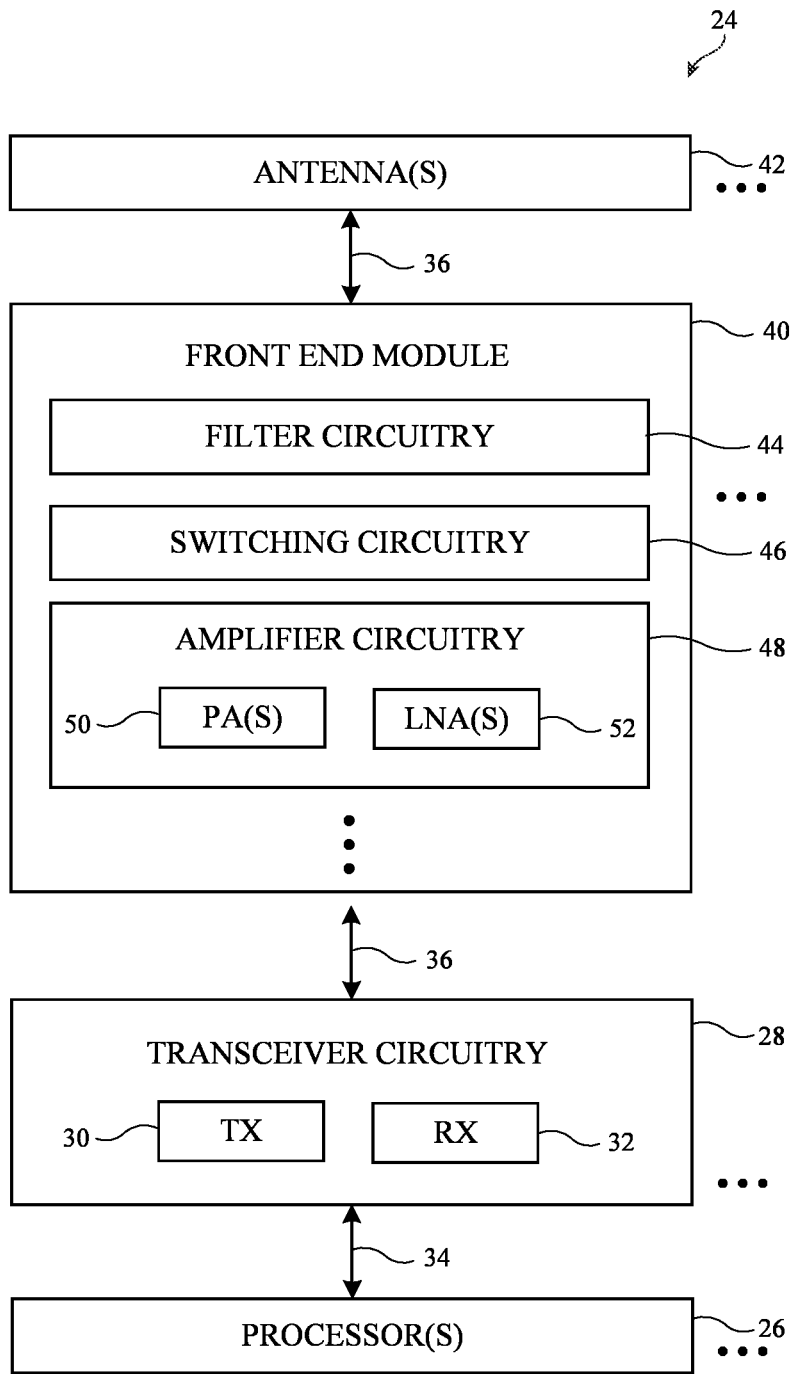
FIG. 2 is a diagram of illustrative wireless circuitry including antennas in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, application specific signal processing hardware, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 into corresponding radio-frequency signals. For example, transceiver circuitry 28 may include mixer circuitry 54 for up-converting (or modulating) the transmit (baseband) signals to radio frequencies prior to transmission over antenna 42. The example of FIG. 2 in which processor 26 communicates with transceiver 28 is merely illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry 54 for down-converting (or demodulating) the received radio-frequency signals to baseband frequencies prior to conveying the received signals to processor 26 over path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip. If desired, amplifier circuitry 48 and/or other components in front end 40 such as filter circuitry 44 may also be implemented as part of transceiver circuitry 28.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

Figure 3:
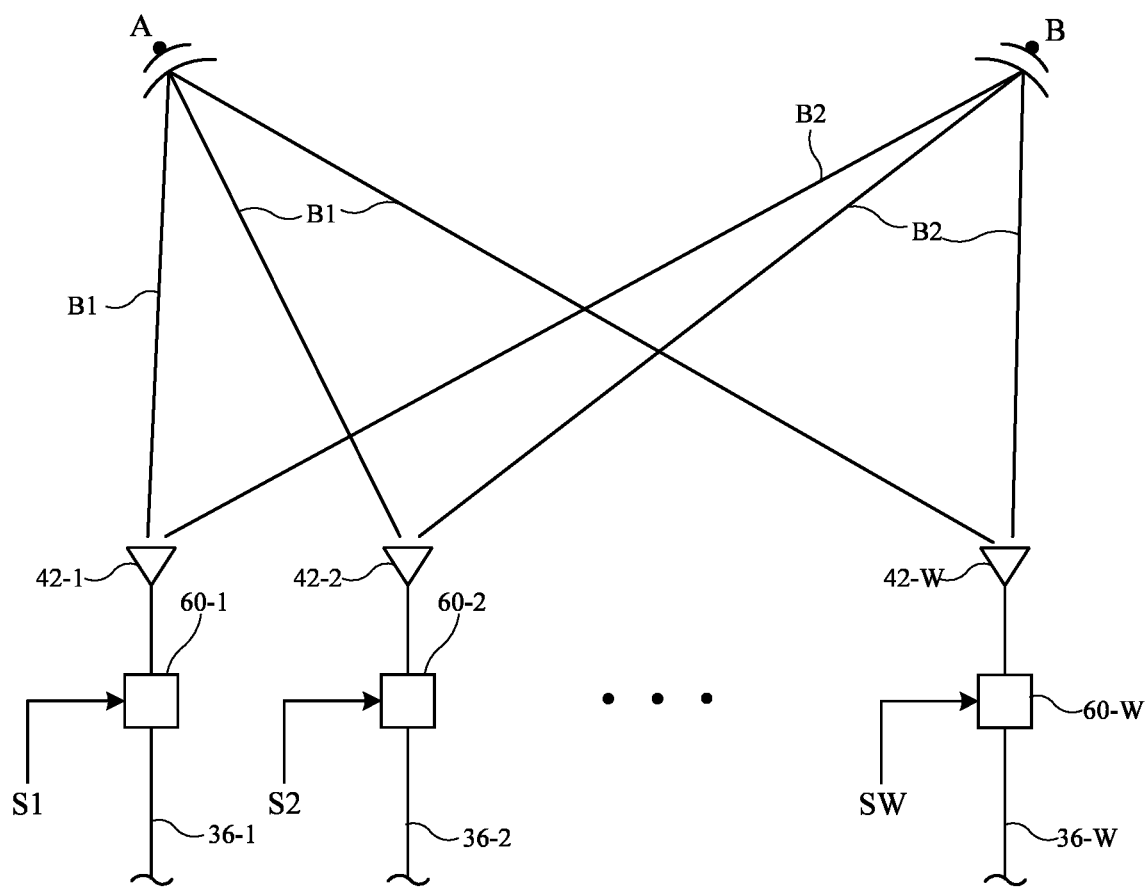
FIG. 3 is a diagram of an illustrative phased antenna array that may be adjusted to form beams of signals oriented in different directions in accordance with some embodiments.

Two or more antennas 42 may be arranged in one or more phased antenna arrays. FIG. 3 shows how antennas 42 may be formed in a corresponding phased antenna array 62. As shown in FIG. 3, phased antenna array 62 (sometimes referred to herein as array 62, antenna array 62, or array 62 of antennas 42) may be coupled to radio-frequency transmission lines 36. For example, a first antenna 42-1 in phased antenna array 62 may be coupled to a first radio-frequency transmission line 36-1, a second antenna 42-2 in phased antenna array 62 may be coupled to a second radio-frequency transmission line 36-2, . . . , and a $W^{th}$ antenna 42-W in phased antenna array 62 may be coupled to a $W^{th}$ radio-frequency transmission line 36-W, etc. While antennas 42 are described herein as forming a phased antenna array, the antennas 42 in phased antenna array 62 may sometimes also be referred to as collectively forming a single phased array antenna (e.g., where antennas 42 form antenna elements of the phased array antenna).

Antennas 42 in phased antenna array 62 may be arranged in any desired number of rows and columns or in any other desired pattern (e.g., the antennas need not be arranged in a grid pattern having rows and columns). Each antenna 42 may be separated from one or more adjacent antennas in phased antenna array 62 by a predetermined distance such as approximately half an effective wavelength of operation of the array. During signal transmission operations, radio-frequency transmission lines 36 may be used to supply signals (e.g., radio-frequency signals such as millimeter wave and/or centimeter wave signals) from transceiver circuitry to phased antenna array 62 for wireless transmission. During signal reception operations, radio-frequency transmission lines 36 may be used to supply signals received at phased antenna array 62 (e.g., from external wireless equipment or transmitted signals that have been reflected off of external objects) to transceiver circuitry.

The use of multiple antennas 42 in phased antenna array 62 allows beam forming/steering arrangements to be implemented by controlling the relative phases and magnitudes (amplitudes) of the radio-frequency signals conveyed by the antennas. In the example of FIG. 3, antennas 42 each have a corresponding radio-frequency phase and magnitude controller 60 (e.g., a first phase and magnitude controller 60-1 disposed on radio-frequency transmission line 36-1 may control phase and magnitude for radio-frequency signals handled by antenna 42-1, a second phase and magnitude controller 60-2 disposed on radio-frequency transmission line 36-2 may control phase and magnitude for radio-frequency signals handled by antenna 42-2, . . . , and a $W^{th}$ phase and magnitude controller 60-W disposed on radio-frequency transmission line 36-W may control phase and magnitude for radio-frequency signals handled by antenna 42-W, etc.).

Phase and magnitude controllers 60 may each include circuitry for adjusting the phase of the radio-frequency signals on radio-frequency transmission lines 36 (e.g., phase shifter circuits) and/or circuitry for adjusting the magnitude of the radio-frequency signals on radio-frequency transmission lines 36 (e.g., power amplifier and/or low noise amplifier circuits). Phase and magnitude controllers 60 may sometimes be referred to collectively herein as beam steering circuitry or beam forming circuitry (e.g., beam steering/forming circuitry that steers/forms the beam of radio-frequency signals transmitted and/or received by phased antenna array 46).

Phase and magnitude controllers 60 may adjust the relative phases and/or magnitudes of the transmitted signals that are provided to each of the antennas in phased antenna array 62 and may adjust the relative phases and/or magnitudes of the received signals that are received by phased antenna array 62. Phase and magnitude controllers 60 may, if desired, include phase detection circuitry for detecting the phases of the received signals that are received by phased antenna array 62. The term "beam" or "signal beam" may be used herein to collectively refer to wireless signals that are transmitted and/or received by phased antenna array 62 in a particular direction. Each beam may exhibit a peak gain that is oriented in a respective beam pointing direction at a corresponding beam pointing angle (e.g., based on constructive and destructive interference from the combination of signals from each antenna in the phased antenna array). Different sets of phase and magnitude settings for phase and magnitude controllers 60 may configure phased antenna array 62 to form different beams in different beam pointing directions.

If, for example, phase and magnitude controllers 60 are adjusted to produce a first set of phases and/or magnitudes, the signals will form a beam as shown by beam B1 of FIG. 3 that is oriented in the direction of point A. If, however, phase and magnitude controllers 60 are adjusted to produce a second set of phases and/or magnitudes, the signals will form a beam as shown by beam B2 that is oriented in the direction of point B. Each phase and magnitude controller 60 may be controlled to produce a desired phase and/or magnitude based on a corresponding control signal S received from control circuitry 14 of FIG. 1 (e.g., the phase and/or magnitude provided by phase and magnitude controller 60-1 may be controlled using control signal S1, the phase and/or magnitude provided by phase and magnitude controller 60-2 may be controlled using control signal S2, . . . , and the phase and/or magnitude provided by phase and magnitude controller 60-W may be controlled using control signal SW, etc.). If desired, the control circuitry may actively adjust control signals S in real time to steer (form) the beam in different desired directions over time. Phase and magnitude controllers 60 may provide information identifying the phase of received signals to control circuitry 14 if desired.

When performing wireless communications using radio-frequency signals at relatively high frequencies such as millimeter and centimeter wave frequencies, radio-frequency signals are conveyed over a line-of-sight path between phased antenna array 62 and external communications equipment. If the external equipment is located at point A of FIG. 3, phase and magnitude controllers 60 may be adjusted to steer the signal beam towards point A (e.g., to steer the pointing direction of the signal beam towards point A). Phased antenna array 62 may transmit and receive radio-frequency signals in the direction of point A. Similarly, if the external equipment is located at point B, phase and magnitude controllers 60 may be adjusted to steer the signal beam towards point B (e.g., to steer the pointing direction of the signal beam towards point B). Phased antenna array 62 may transmit and receive radio-frequency signals in the direction of point B.

In the example of FIG. 3, beam steering is shown as being performed over a single degree of freedom for the sake of simplicity (e.g., towards the left and right on the page of FIG. 3). However, in practice, the beam may be steered over two or more degrees of freedom (e.g., in three dimensions, into and out of the page and to the left and right on the page of FIG. 3). Phased antenna array 62 may have a corresponding field of view over which beam steering can be performed (e.g., in a hemisphere or a segment of a hemisphere over the phased antenna array).

If desired, device 10 may include multiple phased antenna arrays 62 that each face a different direction to provide coverage from multiple sides of the device. Each phased antenna array 62 may be formed as a part of a respective antenna panel (AP) within device 10. If desired, multiple phased antenna arrays 62 may be disposed on a single antenna panel and/or a single phased antenna array 62 may be distributed across two or more antenna panels. The antenna panels may be disposed at different locations on device 10 for providing a full sphere of beam coverage around device 10.

It can be challenging to house and connect all of the various wireless components within device 10. There is often a limited amount of space within the housing of device 10. As the number of components within device 10 increases, it can also be challenging to route signals between the various components while satisfying performance criteria.

Figure 4:
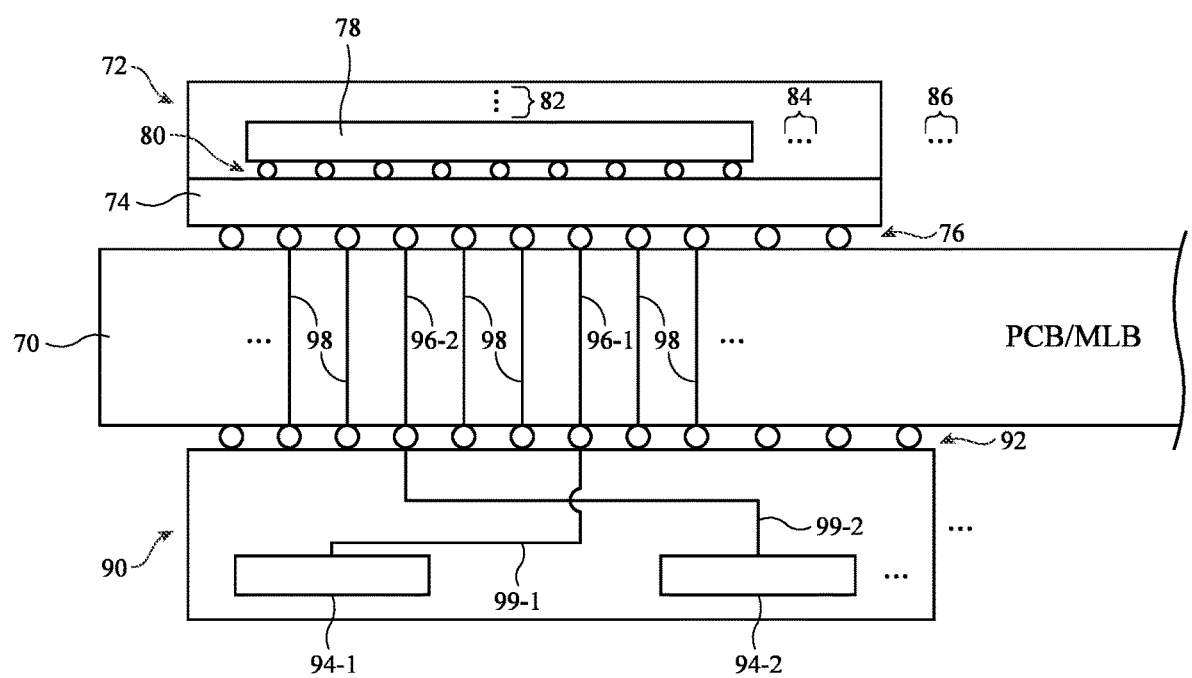
FIG. 4 is a cross-sectional side view of an assembly that includes a radio-frequency integrated circuit and an antenna module mounted on opposing sides of a printed circuit board in accordance with some embodiments.

In accordance with some embodiments, device 10 may include a printed circuit board such as printed circuit board (PCB) 70 and components mounted on both (opposing) surfaces of board 70 (see, e.g., FIG. 4). Printed circuit board 70 is sometimes referred to as a main logic board (MLB). As shown in FIG. 4, a semiconductor package such as semiconductor package 72 can be mounted on a first (upper)

surface of board 70, whereas an antenna module such as antenna module 90 can be mounted on a second (lower) surface of board 70. Antenna module 90 is sometimes referred to as an antenna assembly. The terms "upper" (top) and "lower" (bottom) surfaces referring to the opposing exterior mounting surfaces of printed circuit board 70 as shown in the orientation of FIG. 4 are merely illustrative and can be used interchangeably. Although FIG. 4 only shows one package 72 being mounted on the upper surface of board 70, multiple integrated circuits, packages, processors, wireless components, and/or other types of electronic components can be mounted on the upper surface of board 70 (as indicated by ellipses 86). Similarly, although FIG. 4 only shows one antenna assembly 90 mounted on the lower surface of board 70, multiple integrated circuits, packages, processors, wireless components, and/or other types of electronic components can be mounted on the lower surface of board 70. For example, an application processor or a baseband processor may be mounted on the first or second surface of printed circuit board 70. The various components shown in FIG. 4 can sometimes collectively be referred to as an assembly.

Semiconductor package 72 may include an integrated circuit die (chip) such as integrated circuit (IC) 78 mounted on a package substrate 74. Integrated circuit 78 may be mounted on package substrate 74 via solder bumps 80, which are sometimes referred to as flip chip or controlled collapse chip connection (C4) bumps. Integrated circuit 78 may include transceiver circuitry 28 (see FIG. 2), circuitry sometimes considered to be part of front end module 40, and/or other wireless circuitry. Integrated circuit 78 is therefore sometimes referred to as a radio-frequency integrated circuit (RFIC) chip or a radio-frequency transceiver circuit, whereas package 72 is sometimes referred to as a system in package (SIP). Although FIG. 4 shows only one integrated circuit 78 disposed within package 72, package 72 can optionally include one or more additional integrated circuits stacked on top of chip 78 as shown by dots 82 (e.g., to form a three-dimensional stacked IC configuration) and/or can include one or more additional integrated circuits mounted laterally adjacent to chip 78 on package substrate 74 as shown by dots 84 (e.g., to form a two-dimensional multichip package). If desired, one or more additional packages or processing units can be mounted on the upper surface of board 70 as shown by dots 86. Package 72 may be coupled to printed circuit board 70 via an array of solder balls 76 sometimes referred to as a ball grid array (BGA). Solder balls 76 at the interface of package 72 and board 70 may generally be larger than the solder bumps 80 at the interface of RFIC chip 78 and package substrate 74. Underfill material can optionally be formed around solder balls 76 to protect the electrical connection between package 72 and printed circuit board 70.

Antenna module 90 may be mounted on an opposing surface of printed circuit board 70 to save space. Antenna module 90 may include one or more antennas. In the example of FIG. 4, antenna module 90 may include at least a first antenna such as antenna 94-1 and a second antenna such as antenna 94-2. Antennas 94-1 and 94-2 may form part of a phased antenna array (see, e.g., array 62 of FIG. 3). Although FIG. 4 shows antenna module 90 as having at least two antenna components, antenna module 90 may in general include three or more antenna structures, four to ten antenna structures, 10 to 20 antenna structures, or more than 20 antenna structures. Antenna module 90 may be coupled to printed circuit board 70 via an array of solder balls 92 sometimes referred to as a ball grid array. Solder balls 92 at the interface of antenna module 90 and board 70 may generally be larger than the solder bumps 80 at the interface of RFIC chip 78 and package substrate 74. Underfill material can optionally be formed around solder balls 92 to protect the electrical connection between antenna module 90 and printed circuit board 70.

Package 72, which includes radio-frequency integrated circuit 78, may communicate with antenna module 90 using direct connections passing through printed circuit board 70. In FIG. 4, line 96-1 may represent a signal connection coupling a corresponding solder ball 76 to first antenna 94-1. In other words, radio-frequency signals can be conveyed between integrated circuit 78 and antenna 94-1 via signal connection 96-1. A signal routing line 99-1 in antenna module 90 may couple signal connection 96-1 and antenna 94-1. Similarly, line 96-2 may represent a signal connection coupling a corresponding solder ball 76 to second antenna 94-2. In other words, radio-frequency signals can be conveyed between integrated circuit 78 and antenna 94-2 via signal connection 96-2. Another signal routing line 99-2 in antenna module 90 may couple signal connection 96-2 and antenna 94-2.

The signal connections such as signal connections 96-1 and 96-2 for conveying radio-frequency signals through printed circuit board 70 may be straight passthrough or direct connections (e.g., there is no lateral routing or signal fanout provided within printed circuit board 70). The passthrough signal connections 96 can be surrounded by ground connections 98. The ground connections 98 can also be straight grounding paths that directly traverse the depth of printed circuit board 70. In other words, the printed circuit board 70 serves merely as a passthrough component linking packages 72 and antenna module 90. Configured in this way, signals can be efficiently conveyed between the RFIC 78 and antenna module 90 in a space saving manner while meeting performance requirements. In some embodiments, signal connections 96 and/or ground connections 98 may be implemented using a set of vertically stacked vias in two or more layers of printed circuit board 70. In some embodiments, signal connections 96 and/or ground connections 98 may be implemented using a set of vertically offset vias in two or more layers of printed circuit board 70. In some embodiments, signal connections 96 and/or ground connections 98 may be implemented using copper pillars.

Figure 5:
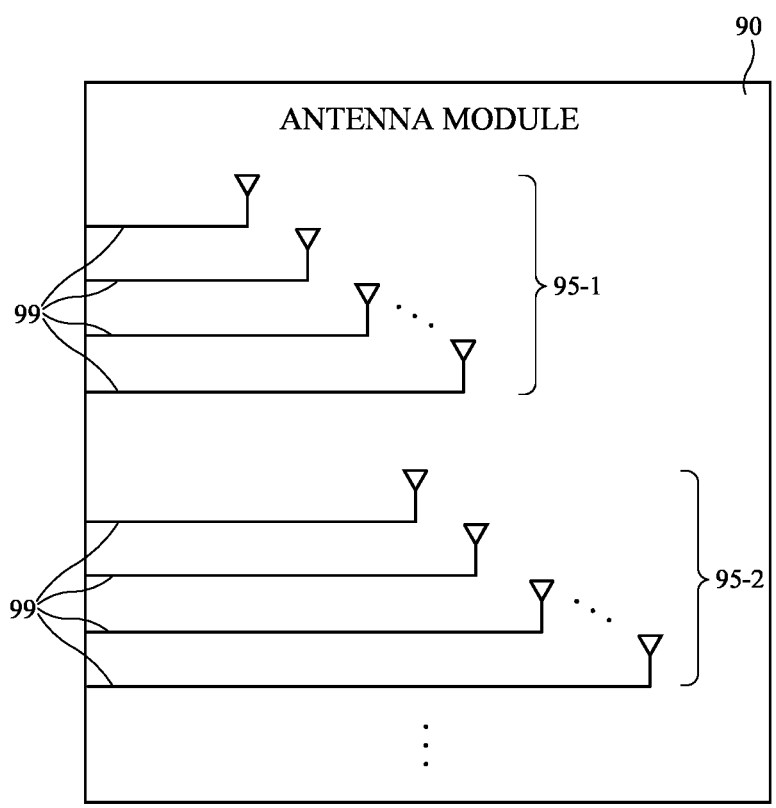
FIG. 5 is a schematic diagram of an illustrative antenna module in accordance with some embodiments.

FIG. 5 shows how antenna module 90 may include multiple groups of antennas. As shown in FIG. 5, antenna module 90 may include a first group of antennas 95-1, a second group of antennas 95-2, and optionally one or more additional groups of antennas. The first group of antennas 95-2 may be configured to operate at a first frequency, whereas the second group of antennas may be configured to operate at a second frequency different than the first frequency. For example, the first group of antennas 95-1 may be configured to operate at 28 GHz while the second group of antennas 95-1 may be configured to operate at 39 GHz. This is illustrative. Antenna module 90 may include any number of antenna groups, each of which is configured to operate at a different radio frequency or millimeter wave range. Antenna module 90 may include a first set of routing paths 99 electrically coupled to the first group of antennas 95-1 and may include a second set of routing paths 99 electrically coupled to the second group of antennas 95-2. In general, antenna module 90 may include two or more groups of antennas, three or more groups of antennas, four to ten groups of antennas, or more than 10 groups of antennas.

Figure 6:
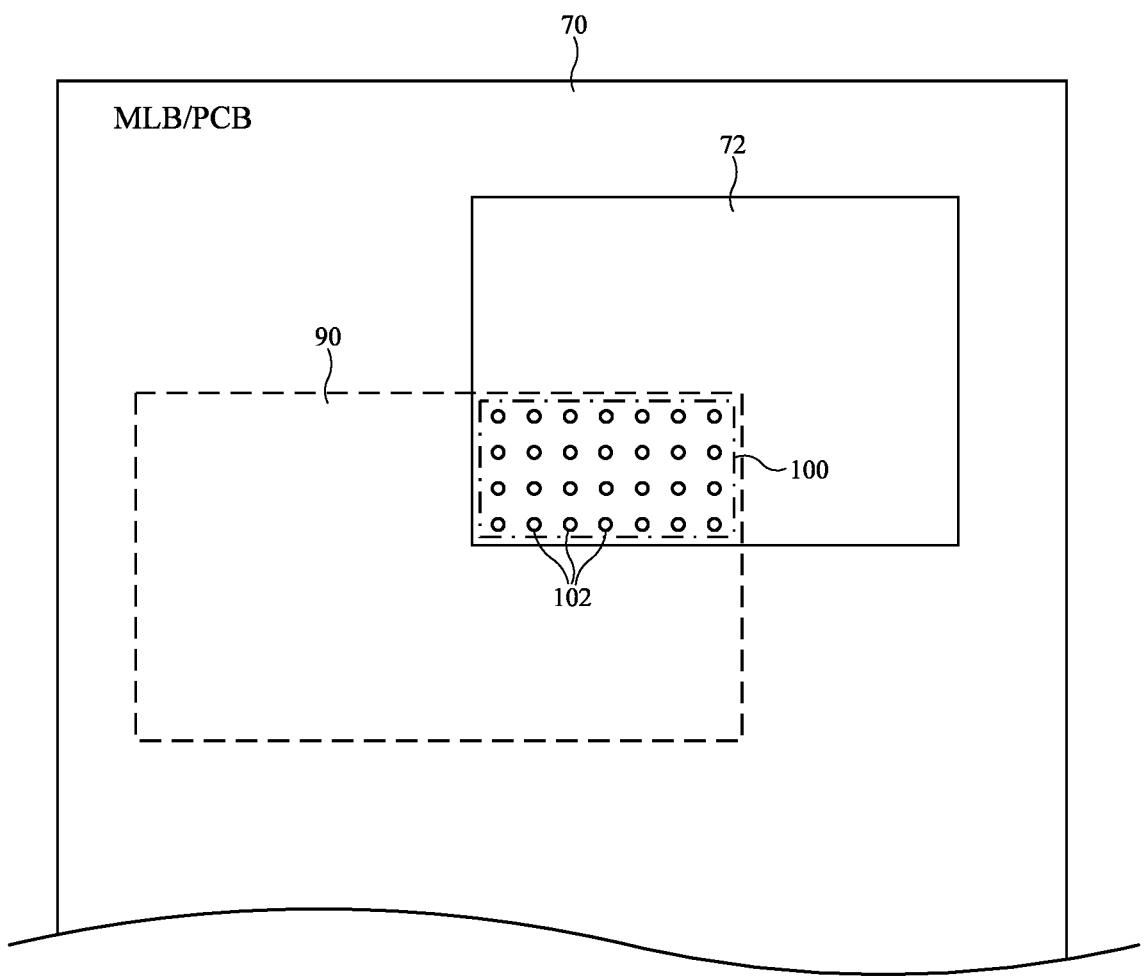
FIG. 6 is a top (bird's-eye) view showing an overlapping region between a radio-frequency integrated circuit and an antenna module in accordance with some embodiments.

FIG. 6 is a top (bird's-eye) view showing an overlapping region between package 72, which includes radio-frequency integrated circuit 78, and antenna module 90 when mounted on opposing surfaces of printed circuit board 70. Package 72 may be mounted on the upper surface of board 70 and may have an illustrative footprint (peripheral outline) as shown by the solid box in FIG. 6. Antenna module 90 may be mounted on the lower surface of board 70 and may have an illustrative footprint (peripheral outline) as shown by the dotted box. As shown in FIG. 6, components 72 and 90 may have an "overlapping" region 100 (e.g., region 100 coincides with both a portion of the footprint of package 72 and a portion of the footprint of antenna module 90) when viewed from atop. Direct signal and ground connections such as connections 102 can be formed in overlapping region 100 through printed circuit board 70 to route signals between components 72 and 90. Connections 102 can include direct (straight) signal connections (see, e.g., connections 96 in FIG. 4) that are surrounded by direct (straight) grounding connections (see, e.g., connections 98 in FIG. 4). The term "direct" or "straight" connections can refer to or be defined herein as elongated paths that travel in the vertical direction through the height of the printed circuit board (without being routed in the lateral direction in the plane of a routing layer within the printed circuit board).

The example of FIG. 6 in which a portion of package 72 overlaps or covers a portion of antenna module 90 is merely illustrative. In other words, the footprint of semiconductor package 72 and the footprint of antenna module 90 are at least partially overlapping. As another example, the entire footprint of package 72 may overlap or cover only a portion of antenna module 90. As another example, a portion of package 72 may overlap or cover the entire footprint of antenna module 90. There can by any amount of overlap or intersection between package 72 and antenna module 90 that are mounted on printed circuit board 70. In general, components 72 and 90 can represent any two separate electrical components of wireless circuitry 24 or control circuitry 14.

Figure 7:
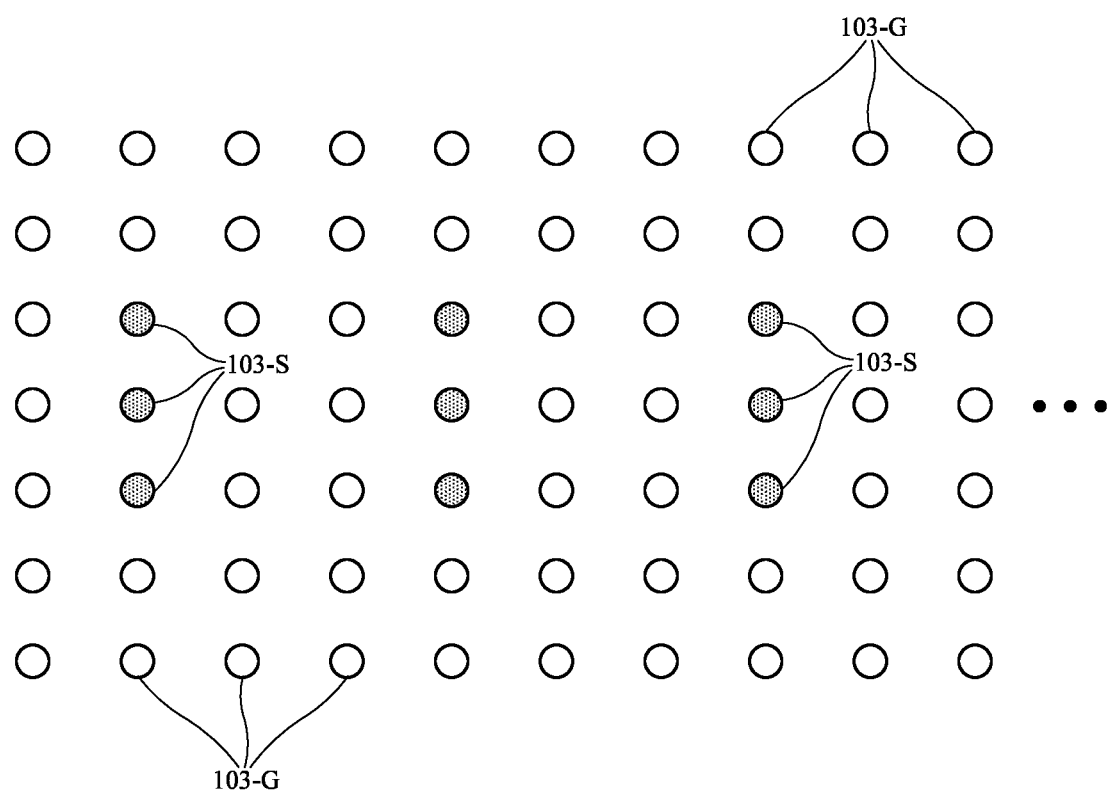
FIG. 7 is a top view of an illustrative array of signal and grounding pins on a printed circuit board in accordance with some embodiments.

FIG. 7 is a top view of an illustrative array of signal and grounding pins that can be formed on a surface of the printed circuit board. This array of pins may represent connections corresponding to the solder balls 76 at the interface of package 72 and the first surface of board 70 and/or to the solder balls 92 at the interface of antenna module 90 and the second surface of board 70. As shown in FIG. 7, the array of pins can include signal pins 103-S (e.g., pins for conducting radio-frequency signals) and ground pins 103-G (e.g., pins for conducting a ground voltage). The signal pins 103-S may be surrounded by the ground pins 103-G. The signal pins 103-S may be coupled to the signal connections 96 (see FIG. 4), whereas the ground pins 103-G may be coupled to the grounding connections 98. In the example of FIG. 7, the signal pins 103-S are organized into groups of three (e.g., each group of signal pins includes three consecutive or adjacent signal pins). This is merely illustrative. In general, each group of signal pins can include only one signal pin 103-S that is surrounded by ground pins 103-G, two or more adjacent signal pins 103-S bordered by surrounding ground pins 103-G, three or more adjacent signal pins 103-S bordered by surrounding ground pins 103-G, four or more adjacent signal pins 103-S bordered by surrounding ground pins 103-G, five to ten adjacent signal pins 103-S bordered by surrounding ground pins 103-G, or more than ten adjacent signal pins 103-S bordered by surrounding ground pins 103-G.

Figure 8:
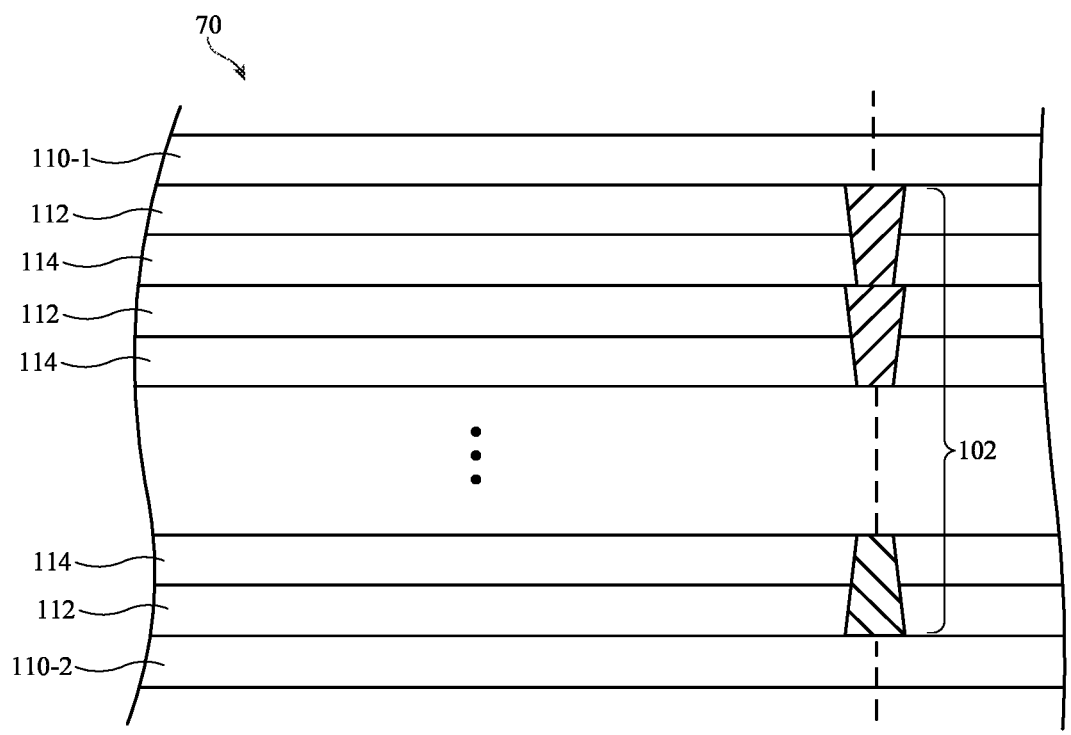
FIG. 8 is a cross-sectional side view of an illustrative printed circuit board with passthrough connections formed using through-board stacked via structures in accordance with some embodiments.

FIG. 8 is a cross-sectional side view of printed circuit board 70 showing one or more direct passthrough connections 102 formed using through-board stacked via structures. As shown in FIG. 8, board 70 may include alternating signal routing layers 112 and via (contact) layers 114. Metal routing lines can be formed in the signal routing layers 112, whereas metal vias can be formed in the via layers 114. The metal routing lines and the metal vias are insulated by dielectric material within layers 112 and 114. Although metal paths can be routed laterally within the signal routing layers 112, the passthrough connection(s) 102 need not include any lateral routing. Conductive structures within layers 112 and 114 can be stacked directly on top of one another in a straight line to form the stacked via structures traversing the height of board 70 as shown in FIG. 8. In other words, the vertically stacked via structures can extend from the upper surface of board 70 to the lower surface of board 70. A first solder mask layer 110-1 can optionally be formed on the top surface of board 70. A second solder mask layer 110-2 can optionally be formed on the bottom surface of board 70. If desired, one or more additional passivation or buffer layers can be formed in printed circuit board 70.

Since only direct (straight) signal path connections are used to convey signals through printed circuit board 70, there needs to be a way to route those signal paths to the various antenna elements on antenna module 90. In accordance with some embodiments, antenna module 90 can include multiple routing layers. Routing paths in the routing layers can facilitate signal routing or signal fanout for various antenna signal paths.

Figure 9A:
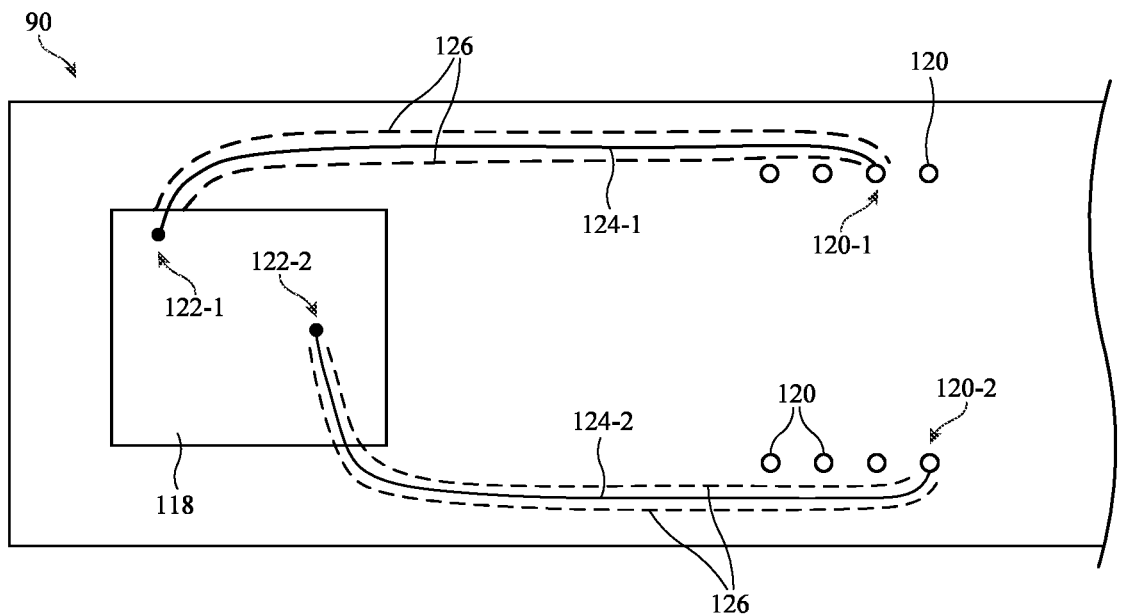
FIG. 9A is a top (layout) view showing a first routing layer of an illustrative antenna module in accordance with some embodiments.

FIG. 9A is a top (layout) view showing a first routing layer of antenna module 90. As shown in FIG. 9A, antenna module 90 may include one or more antenna structure 118, which can represent an antenna or a group of antennas. Antenna module 90 may include signal pins 120. In particular, at least signal pins 120-1 and 120-2 on antenna module 90 may be coupled to corresponding signal pins in the array of conductive pins of the type described in connection with FIG. 7. First antenna module signal pin 120-1 may be coupled to antenna structure 118 (see connection point 122-1) using a first routing path (wire) 124-1, whereas second antenna module signal pin 120-2 may be coupled to antenna structure 118 (see connection point 122-2) using a second routing path (wire) 124-2. Routing wires 124-1 and 124-2 can be flanked by ground paths (wires) 126 also formed in the first routing layer of antenna module 90. For instance, a pair of grounding wires 126 may be routed along both sides of signal routing wires 124-1. The example of FIG. 9A in which antenna structure 118 is connected to two signal pins 120 in the first routing layer is merely illustrative. As another example, antenna structure 118 may be couple to only one signal pin 120 via a single routing wire, to two or more signal pins 120 via at least two (fanout) routing wires, to three or more signal pins 120 via at least three (fanout) routing wires, or to more than three signal pins 120 via at least four (fanout) routing wires in the first routing layer.

Figure 9B:
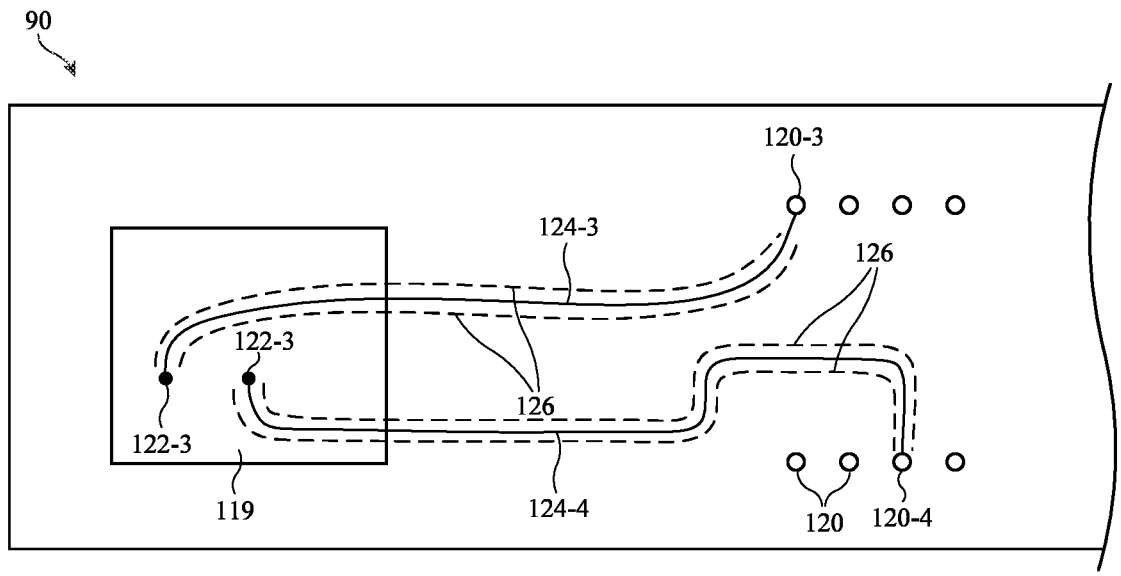
FIG. 9B is a top (layout) view showing a second routing layer of an illustrative antenna module in accordance with some embodiments.

FIG. 9B is a top (layout) view showing a second routing layer of antenna module 90. As shown in FIG. 9B, antenna structure 118 may be coupled to at least a third signal pin 120-3 and a fourth signal pin 120-4 in the second routing layer of antenna module 90. Signal pins 120-3 and 120-4 may be coupled to corresponding signal pins in the array of conductive pins of the type described in connection with FIG. 7. Third antenna module signal pin 120-3 may be coupled to antenna structure 118 (see connection point 122-3) using a third routing path (wire) 124-3, whereas fourth antenna module signal pin 120-4 may be coupled to antenna structure 118 (see connection point 122-4) using a fourth routing path (wire) 124-4. Routing wires 124-3 and 124-4 can be flanked by ground paths (wires) 126 also formed in the second routing layer of antenna module 90.

For instance, a pair of grounding wires 126 may be routed along both sides of signal routing wires 124-4. The example of FIG. 9B in which antenna structure 118 is connected to two signal pins 120 in the second routing layer is merely illustrative. As another example, antenna structure 118 may be couple to only one signal pin 120 via a single routing wire, to two or more signal pins 120 via at least two (fanout) routing wires, to three or more signal pins 120 via at least three (fanout) routing wires, or to more than three signal pins 120 via at least four (fanout) routing wires in the second routing layer.

Routing signal paths in this way can facilitate complex fanout or signal untangling when distributing signals from the direct signal connections through printed circuit board 70 to the various antenna structures in antenna module 90. In general, antenna module 90 may include any number of antenna structures each of which is coupled to one or more signal pins in this way. Antenna module 90 may include two or more routing layers, three or more routing layers, four or more routing layers, five to ten routing layers, or more than 10 routing layers that include signal routing paths for coupling to the various antenna structures in antenna module 90.

The foregoing is merely illustrative and various modifications can be made to the described embodiments. The foregoing embodiments may be implemented individually or in any combination.

What is claimed is:

1. An assembly comprising:
   a printed circuit board having a first outer surface and a second outer surface opposing the first outer surface;
   a semiconductor package disposed on the first outer surface of the printed circuit board and occupying a first region on the printed circuit board;
   an antenna module disposed on the second outer surface of the printed circuit board and occupying a second region on the printed circuit board, wherein the first and second regions are at least partially overlapping in an overlapping region;
   first solder balls disposed between the semiconductor package and the first outer surface of the printed circuit board;
   second solder balls disposed between the antenna module and the second outer surface of the printed circuit board; and
   underfill material around the first solder balls.

2. The assembly of claim 1, wherein the printed circuit board comprises stacked via structures that extend from the first outer surface to the second outer surface and that electrically couple the semiconductor package to the antenna module.

3. The assembly of claim 1, wherein the stacked via structures are located in the overlapping region.

4. The assembly of claim 1, wherein the printed circuit board comprises ground connections that surround the stacked via structures.

5. The assembly of claim 1, wherein the semiconductor package comprises a radio-frequency transceiver integrated circuit.

6. The assembly of claim 1, wherein the antenna module comprises:
   a first antenna configured to receive radio-frequency signals via a first signal path on the antenna module; and
   a second antenna configured to receive radio-frequency signal via a second signal path on the antenna module.

7. The assembly of claim 1, wherein the antenna module comprises:
   an antenna structure;
   a first signal routing line formed in a first routing layer in the antenna module and having a first terminal coupled to the antenna structure at a first location in the first routing layer and a second terminal coupled to a first signal pin at a second location, different than the first location, in the first routing layer; and
   a second signal routing line formed in a second routing layer in the antenna module and having a first terminal coupled to the antenna structure at a third location in the second routing layer and a second terminal coupled to a second signal pin at a fourth location, different than the third location, in the second routing layer.

8. The assembly of claim 7, wherein the antenna module further comprises:
   a pair of ground lines routed along the first signal routing line and formed in the first routing layer.

9. Wireless circuitry comprising:
   a circuit board;
   a radio-frequency transceiver coupled to a first side of the circuit board;
   one or more antennas coupled to a second side of the circuit board that is different than the first side, wherein the one or more antennas are configured to receive radio-frequency signals from the radio-frequency transceiver through via structures traversing a height of the circuit board;
   a first array of solder balls disposed between the radio-frequency transceiver and the first side of the circuit board;
   a second array of solder balls disposed on the second side of the circuit board and coupled to the one or more antennas; and
   underfill material around the second array of solder balls.

10. The wireless circuitry of claim 9, wherein the circuit board comprises ground structures around the via structures, the ground structures traversing the height of the circuit board.

11. The wireless circuitry of claim 9, further comprising underfill material around the first array of solder balls.

12. The wireless circuitry of claim 9, wherein the one or more antennas comprise a phased antenna array.

13. The wireless circuitry of claim 9, wherein:
   the one or more antennas are formed as part of an antenna module; and
   at least one of the antennas is configured to receive radio-frequency signals via a first set of signal routing paths formed in a first routing layer in the antenna module and via a second set of signal routing paths formed in a second routing layer in the antenna module different than the first routing layer.

14. An apparatus comprising:
   a circuit board;
   an integrated circuit coupled to a first side of the circuit board; and
   an antenna module coupled to a second side of the circuit board opposing the first side, wherein the circuit board comprises vertical signal connections configured to convey radio-frequency signals between the integrated circuit and the antenna module, wherein the antenna module comprises:
   an antenna structure; and
   a first signal routing path formed within a first layer of the antenna module, wherein the first signal routing path has a first terminal coupled to the antenna structure at a first location in the first layer and has a second terminal coupled to a first signal pin at a second location, different than the first location, in the first layer.

15. The apparatus of claim 14, wherein the circuit board further comprises vertical ground connections surrounding the signal connections.

16. The apparatus of claim 14, wherein the antenna module further comprises:
   a second signal routing path formed within the first layer, wherein the second signal routing path has a first terminal coupled to the antenna structure at a third location in the first layer and has a second terminal coupled to a second signal pin at a fourth location, different than the third location, in the first layer.

17. The apparatus of claim 16, wherein the antenna module further comprises:
   a third signal routing path formed within a second layer of the antenna module, wherein the third signal routing path has a first terminal coupled to the antenna structure at a fifth location in the second layer and has a second terminal coupled to a third signal pin at a sixth location, different than the fifth location, in the second layer; and
   a fourth signal routing path formed within the second layer, wherein the fourth signal routing path has a first terminal coupled to the antenna structure at a seventh location in the second layer and has a second terminal coupled to a fourth signal pin at an eighth location, different than the seventh location, in the second layer.

18. The apparatus of claim 16, wherein the integrated circuit and the antenna module have at least partially overlapping footprints on the circuit board.

\* \* \* \* \*